(12) United States Patent
Guard

(10) Patent No.: US 8,890,824 B2
(45) Date of Patent: Nov. 18, 2014

(54) CONNECTING CONDUCTIVE LAYERS USING IN-MOULD LAMINATION AND DECORATION

(75) Inventor: David Brent Guard, Southampton (GB)

(73) Assignee: Atmel Corporation, San Jose, CA (US)

( * ) Notice: Subject to any disclaimer, the term of this patent is extended or adjusted under 35 U.S.C. 154(b) by 309 days.

(21) Appl. No.: 13/367,958

(22) Filed: Feb. 7, 2012

(65) Prior Publication Data
US 2013/0199915 A1 Aug. 8, 2013

(51) Int. Cl.
*G06F 3/041* (2006.01)

(52) U.S. Cl.
USPC ........................................... 345/173; 345/174

(58) Field of Classification Search
USPC ................................................ 345/173, 174
See application file for complete search history.

(56) References Cited

U.S. PATENT DOCUMENTS

| 7,663,607 | B2 | 2/2010 | Hotelling | |
|---|---|---|---|---|
| 7,875,814 | B2 | 1/2011 | Chen | |
| 7,920,129 | B2 | 4/2011 | Hotelling | |
| 8,031,094 | B2 | 10/2011 | Hotelling | |
| 8,031,174 | B2 | 10/2011 | Hamblin | |
| 8,040,326 | B2 | 10/2011 | Hotelling | |
| 8,049,732 | B2 | 11/2011 | Hotelling | |
| 8,179,381 | B2 | 5/2012 | Frey | |
| 2003/0234769 | A1* | 12/2003 | Cross et al. | 345/173 |
| 2009/0315854 | A1 | 12/2009 | Matsuo | |
| 2011/0057899 | A1* | 3/2011 | Sleeman et al. | 345/174 |
| 2012/0242588 | A1 | 9/2012 | Myers | |
| 2012/0242592 | A1 | 9/2012 | Rothkopf | |
| 2012/0243151 | A1 | 9/2012 | Lynch | |
| 2012/0243719 | A1 | 9/2012 | Franklin | |
| 2013/0076612 | A1 | 3/2013 | Myers | |

FOREIGN PATENT DOCUMENTS

WO WO 2012/129247 9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

*Primary Examiner* — Errol Fernandes
(74) *Attorney, Agent, or Firm* — Baker Botts LLP

(57) ABSTRACT

In one embodiment, a method for forming a touch sensor is provided. The method includes forming a plurality of electrodes on a first substrate. The plurality of electrodes are configured to form a plurality of capacitive nodes. Each capacitive node is configured to sense touch of an object proximate a touch sensing area of the substrate. The method further includes compressing together a plurality of conductive pads at least in part by applying a resin in liquid form to a first substrate, the resin being applied under pressure. A first one of the plurality of conductive pads had been formed on the first substrate. A second one of the plurality of conductive pads had been formed on a second substrate.

9 Claims, 2 Drawing Sheets

CONNECTING CONDUCTIVE LAYERS USING IN-MOULD LAMINATION AND DECORATION

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Certain embodiments disclosed herein provide a method and apparatus for electrically interconnecting various stacked layers of a touch sensor using an in-mould lamination ("IML") process. The IML process may facilitate holding conductive pads of various layers in compression against each other, thereby facilitating electrical conductivity between the layers. In certain embodiments, the manufacturing efficiency may be increased by facilitating a higher die density per wafer, as explained further below. In addition, certain embodiments may facilitate the mechanical and/or electrical coupling of various layers, including the mechanical and/or electrical coupling of a flexible printed circuit (FPC) to a substrate upon which touch sensor electrodes are formed.

Figure 1:
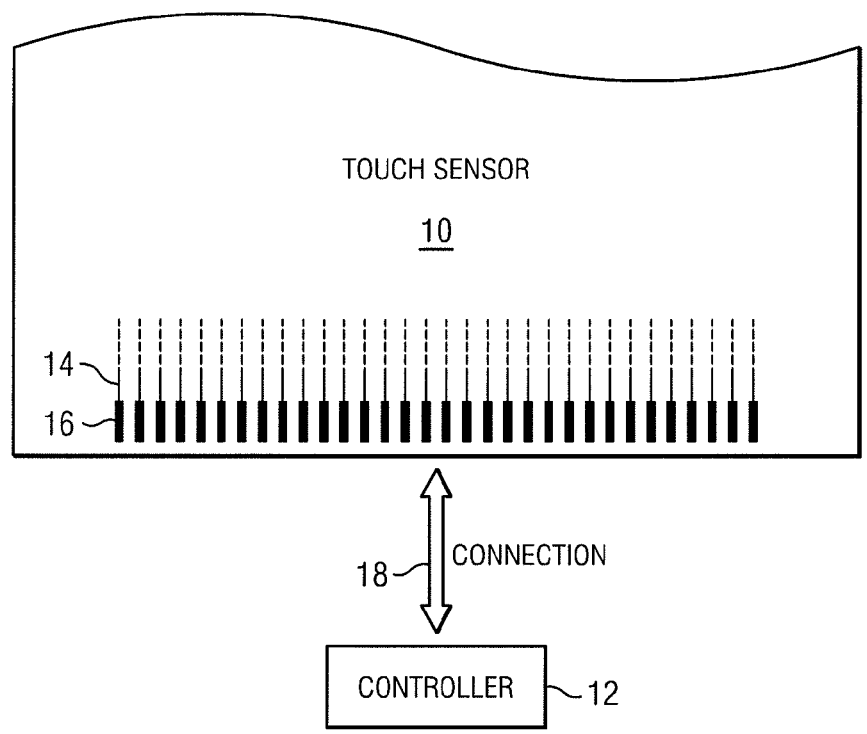
FIG. 1 illustrates an example touch sensor with an example touch-sensor controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, thin line other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium, tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 1% to 10% of the area of its shape in a hatched, mesh, or other suitable pattern. Herein, reference to FLM encompasses such material, where appropriate. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to and/or held in compression against the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 10 µm to 100 µm. As another example, the conductive material of tracks 14 may be silver or silver-based and have a width of approximately 30 µm to 100 µm. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2A:
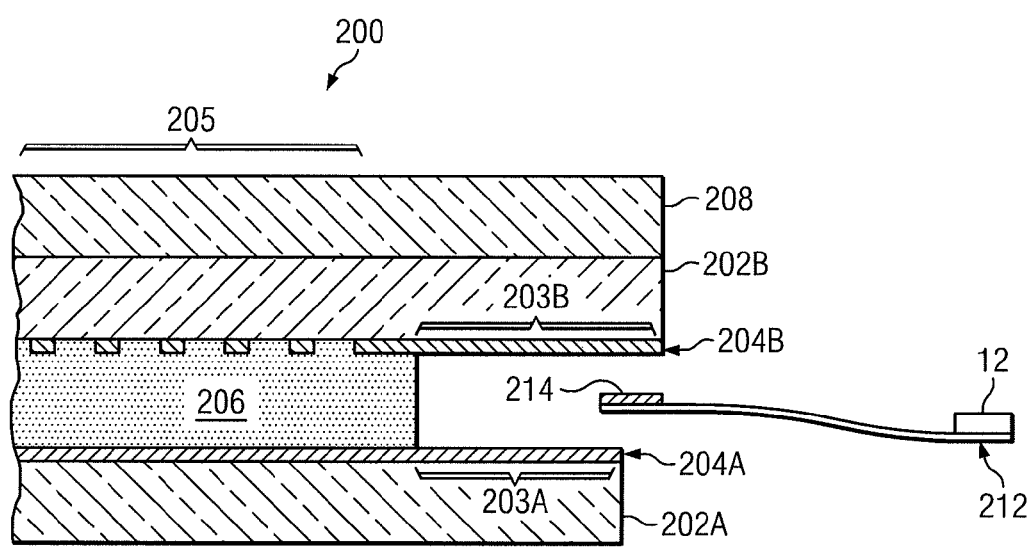
FIGS. 2A and 2B illustrate one embodiment of the touch sensor of FIG. 1 having two substrates held in compression against each other by an in-mould lamination process, such that a conductive pad formed on one of the substrates is electrically interconnected with a conductive pad formed on the other substrate.
Figure 2B:
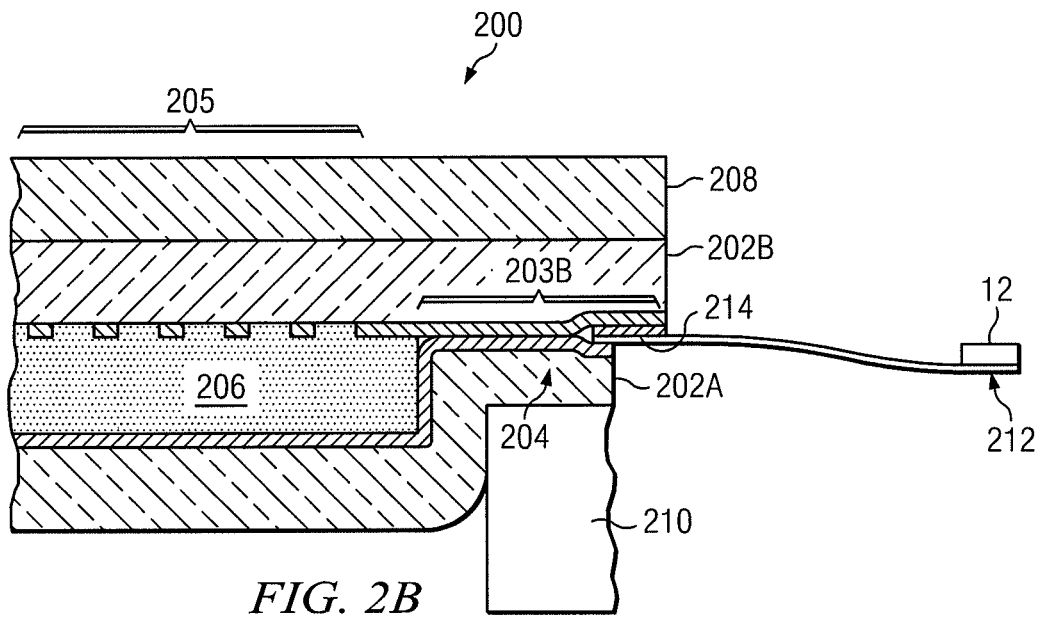

FIGS. 2A and 2B illustrate a cross-section of a portion of a touch sensor 200 at respective stages of formation. Touch sensor 200 may be substantially similar to certain embodiments of the touch sensor 10 of FIG. 1. As shown in FIG. 2A, touch sensor 200 includes two substrates 202A and 202B each having disposed thereon one or more respective layers of conductive material 204A and 204B, respectively. Conductive material 204A is disposed on a surface of substrate 202A that opposes a surface of substrate 202B upon which conductive material 204B is disposed. One or more layers of dielectric material 206 are disposed between and space apart respective portions of substrates 202A and 202B. Substrates 202A and 202B extend in a direction away from dielectric material 206 along respective axes that are each parallel to the surface of substrate 202A comprising the conductive material 204, such that dielectric material 206 occupies some but not all of the volume between substrates 202A and 202B. A cover panel 208 is formed outwardly from substrate 204B and provides a touch surface for an active touch-sensing area 205 of touch sensor 200.

Substrates 202, conductive material 204, dielectric material 206, and cover panel 208 may have the same or substantially similar structure and function of their respective corresponding features described above with reference to the touch sensor 10 of FIG. 1. For example, substrates 202 may each include one or more layers of transparent dielectric material. In certain embodiments, dielectric material 206 may be an OCA that is adhered to each substrate 202A and 202B. The OCA may be 25 µm to 100 µm thick; however, any suitable thickness may be used. The stack of material shown in FIGS. 2A and 2B may include one or more interstitial layers (not shown). For example, an OCA disposed between substrate 202B and cover panel 208 may facilitate coupling substrate 202B and cover panel 208 together. The OCA may at least partially overlay and protect certain conductive elements formed from conductive material 204, such as sense electrodes, drive electrodes, and tracks 14. Regardless of the particular material used as dielectric material 206, it may be omitted and/or removed (e.g., by application of a solvent) from the areas of substrates 202A and 202B on which the conductive pads 203A and 203B are formed, so as not to interfere with electrical coupling between substrates 202A and 202B and/or the electrical coupling between each of those substrates 202 and the controller 12 of FIG. 1.

Conductive material 204A and 204B may each be used to form a respective array of the electrodes described previously with reference to FIG. 1. For example, conductive material 204A may be used to form drive electrodes having first orientation (e.g., along an x-axis); and conductive material 204B may be used to form sense electrodes having a second orientation substantially perpendicular to the first orientation (e.g., along a y-axis); however, any suitable electrode orientation and type may be used including, for example, alternative electrode configurations discussed above with reference to FIG. 1. The plurality of electrodes formed on substrate 204A each configured to form a capacitively coupled node with at least one of the plurality of electrodes formed on substrate 204B. Each capacitively coupled node may be configured to sense touch of an object, as described above with reference to FIG. 1. Additionally, conductive material 204A and 204B may each be used to form conductive pads 203A and 203B, respectively. Conductive pads 203 are each formed on the portions of substrates 203 extending in a direction away from dielectric material 206.

As shown in FIG. 2B, the portions of substrates 202A and 202B extending beyond dielectric material 206 may be held in compression against each other, at least in part, by a frame 210 formed using an IML process. Conductive pads 203A and 203B are aligned with respect to each other such that the compression of substrates 202A and 202B against each other forms a conductive connection between conductive pads 203A and 203B. In particular embodiments, the touch-sensor controller 12 of FIG. 1 may be disposed on a flexible printed circuit (FPC) 212 having a conductive pad 214 that is electrically coupled to conductive pad 203B (e.g., by compression and/or bonding).

In certain embodiments, at least a portion of conductive pad 214 may be held in compression between conductive material 204A and 204B of substrates 202A and 202B, respectively, thereby facilitating the electrical coupling of conductive pad 214 with conductive pad 203B. Additionally or alternatively, conductive pad 214 may be bonded to conductive pad 203B using, for example, an anisotropic conductive adhesive (ACA), such as ACF or anisotropic conductive paste (ACP). FPC 212 may be coupled to the remainder of touch sensor 202, such that conductive material 204A, conductive material 204B, and controller 12 are all electrically coupled together.

During manufacturing, the IML process used to form frame 210 may include the following steps. An IML tool may inject a suitable material (such as a clear resin) at a high temperature on and around the stack of layers of touch sensor 200. The material may be injected from various injection gates of the IML tool. As the material cools, it hardens and adheres to the stack of materials, thereby forming frame 210. Any suitable material may be used, such as, for example, PMMA, polycarbonate. In certain embodiments, the same or a substantially similar IML process may be used to form cover panel 208, before, after, or simultaneous with the formation of frame 210. In a particular embodiment, the formation of cover panel 208 may be considered a "first shot" and the formation of frame 210 may be considered a "second shot;" however, cover panel 208 and frame 210 may be formed in any suitable order. If an IML process is used to form cover panel 208, the material(s) used to form touch sensor 200 may also have a melting point that is high enough to provide adequate protection against washout if a high temperature resin is applied during IML. In certain embodiments, all or a majority of the material used to form frame 210 may be optically opaque; and all or a majority of the material used to form cover panel 208 may be optically transmissive.

Figure 3:
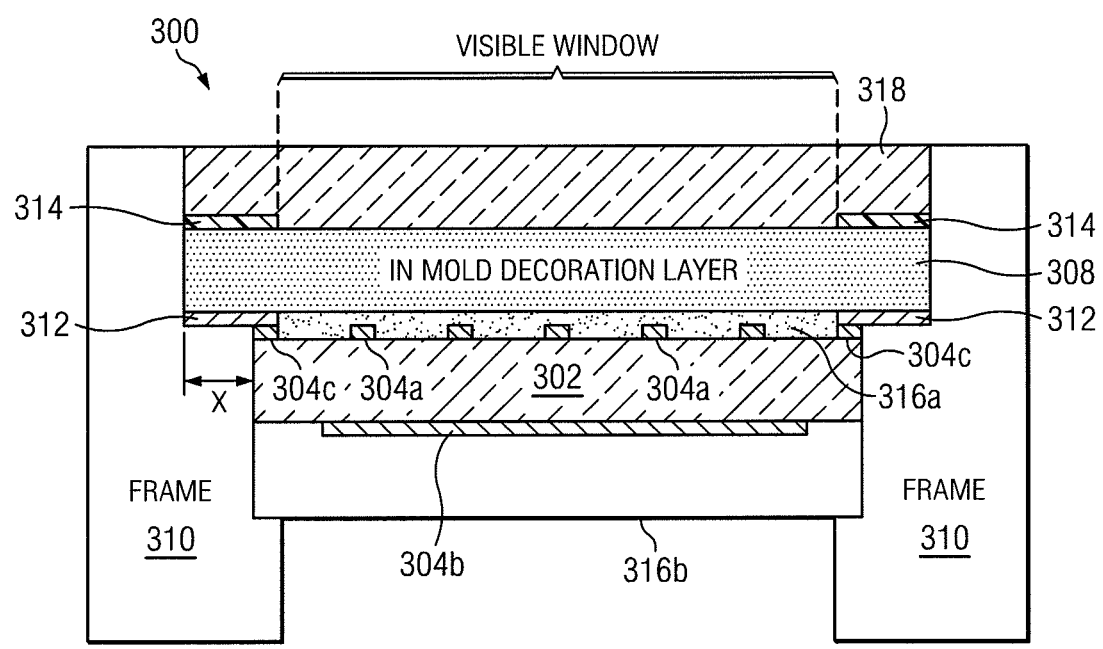
FIG. 3 illustrates an alternative embodiment of the touch sensor of FIG. 1 that uses an in-mould lamination process to hold a ground ring in compression against a substrate having touch sensing electrodes formed thereon.

FIG. 3 illustrates a cross-section of a portion of a touch sensor 300 that uses an in-mould lamination process to hold conductive material 312 formed on in-mould decoration layer 308 in compression against conductive material 304 formed on a substrate 302. Touch sensor 300 may be substantially similar to certain embodiments of the touch sensor 10 of FIG. 1. As shown in FIG. 3, touch sensor 300 includes an in-mould decoration layer 308 disposed outwardly from substrate 302. Conductive material 312 is disposed on an inward facing surface of in-mould decoration layer 308 and may include a ground wring disposed around a touch-sensing area (shown in FIG. 3 as the VISIBLE WINDOW) of touch sensor 300. A hardened frame 310 formed using an in-mould lamination process is used to hold conductive material 312 in compression against conductive material 304A. A dielectric material 316A is disposed between substrate 302 and in-mould decoration layer 308 at a location generally corresponding to a visible window of touch sensor 300. An optically opaque layer 314 is disposed on an outwardly facing surface of in-mould decoration layer 308. A cover panel 318 is disposed outwardly from the in-mould decoration layer 308.

In certain embodiments, substrate 302 may be dual-sided and include conductive material 304A and 304B formed on opposite-facing surfaces of substrate 302. Dielectric layer 316B may be used to protect the inward-facing conductive material 304B. Although FIG. 3 illustrates a dual-sided substrate 302 having conductive material 304 formed on both its outward-facing and inward-facing surfaces, certain alternative embodiments may use one or more single-sided substrates each having electrodes disposed on only one of its surfaces.

Substrate 302, conductive material 304, frame 310, dielectric material 316, and cover panel 318 may have the same or substantially similar structure and function of substrates 202, conductive material 204, frame 210, dielectric material 206, and cover panel 208, respectively, of FIGS. 2A and 2B. The stack of material shown in FIG. 3 may include one or more interstitial layers (not shown). Substrate 302 may include one or more layers of transparent dielectric material.

Conductive material 304A and 304B may each be used to form a respective array of the electrodes described previously with reference to FIGS. 1, 2A and 2B. For example, conductive material 304A may be used to form drive electrodes having first orientation (e.g., along an x-axis); and conductive material 304B may be used to form sense electrodes having a second orientation substantially perpendicular to the first orientation (e.g., along a y-axis); however, any suitable electrode orientation and type may be used including, for example, alternative electrode configurations discussed above with reference to FIG. 1. The plurality of electrodes formed from conductive material 304A may each be configured to form a capacitively coupled node with at least one of the plurality of electrodes formed from conductive material 304B. Each capacitively coupled node may be configured to sense touch of an object, as described above with reference to FIG. 1. Additionally, conductive material 304A and 304B may each be used to form conductive pads 304C. Conductive pads 304C may be used to electrically couple substrate 302 to conductive material 312 formed on a surface of in-mould decoration layer 308. In certain embodiments, one or more conductive vias disposed through substrate 302 may electrically couple conductive material 304A formed on an outward-facing surface of substrate 302 with conductive material 304B formed on an inward-facing surface of substrate 302.

In-mould decoration layer 308 may include one or more optically-opaque, decorated surfaces 314 disposed on or within in-mould decoration layer. During manufacturing, the formation of in-mould decoration layer 308 may include the use of a graphic sheet or layer placed inside the injection mold or cast prior to the introduction of fluid plastic. Once molded, the layer becomes an integral part of the resultant plastic piece. The decorated surfaces 314 of in-mould decoration layer 308 are generally disposed along a perimeter of an active touch-sensing area of the electrodes formed from the conductive material 304 on substrate 302. In certain embodiments, the decorated surfaces 314 of in-mould decoration layer 308 may be used to optically mask underlying conductive traces, such as tracks 14, conductive material 312, and/or certain portions of conductive material 304.

Conductive material 312 is formed on an inner surface of in-mould decoration layer. As shown in FIG. 3, conductive material 312 may include a ground ring patterned around the border of in-mould decoration layer 308 and held in compression against the ground connection 304C of the electrodes of touch sensor 300. By forming a ground ring from conductive material 312 disposed on in-mould decoration layer 308, as compared to forming a ground ring instead on substrate 302, the size of the die used in forming and singulating substrate 302 from a larger substrate (e.g., a silicon-based wafer) may be substantially reduced, thereby potentially lowering manufacturing costs and increasing manufacturing efficiency.

In certain embodiments, conductive material 312 may also be used to form one or more capacitive touch sensors (e.g., sliders and/or buttons) disposed along the periphery of the active touch-sensing area of the electrodes formed from the conductive material 304 on substrate 302. Because conductive material 312 is electrically coupled to conductive material 304, at least certain electrodes formed from conductive material 304 may share the same driving source as certain ones of the peripheral capacitive touch sensor(s) formed from conductive material 312. In certain embodiments, a single FPC may be electrically coupled to the main electrodes formed on substrate 302 and to the peripheral capacitive touch sensor(s) formed from conductive material 312. In certain instances, there perimeter of each capacitive touch sensor formed from conductive material 312 may be defined by a decoration patterned using decorated surfaces 314 disposed on or within in-mould decoration layer 308.

In certain embodiments, an FPC substantially similar in structure and function to FPC 212 of FIGS. 2A and 2B may be electrically coupled to conductive material 304B disposed on inward facing surface of substrate 302. In this manner, the conductive material 304A disposed on an outward facing surface of substrate 302 may be electrically coupled to the FPC through the conductive vias electrically interconnecting conductive material 304A and 304B. Alternatively, the FPC may bonded to the in-mould decoration layer 308 and electrically coupled to conductive material 304 through conductive material formed on the surface of in-mould decoration layer 308.

Frame 310 may facilitate holding conductive material 312 in compression against conductive pads 304C of substrate 302. Frame 310 may be using an in-mould lamination ("IML") process. The IML process used to form frame 310 may include the following steps. An IML tool may inject a suitable material (such as a clear resin) at a high temperature on and around the stack of layers of touch sensor 300. The material may be injected from various injection gates of the IML tool. As the material cools, it hardens and adheres to the stack of materials, thereby forming frame 310. Any suitable material may be used, such as, for example, PMMA, polycarbonate. In certain embodiments, the same or a substantially similar IML process may be used to form cover panel 308, before, after, or simultaneous with the formation of frame 310. In a particular embodiment, the formation of cover panel 308 may be considered a "first shot" and the formation of frame 310 may be considered a "second shot." If an IML process is used to form cover panel 308, the material(s) used to form touch sensor 300 may also have a melting point that is high enough to provide adequate protection against washout if a high temperature resin is applied during IML. In certain embodiments, the material used to form frame 310 may be optically opaque and the material used to form cover panel 308 may be optically transmissive.

In certain embodiments, dielectric material 316A and 316B may each be an OCA that is adhered to a surface of substrate 302. In certain instances, dielectric material 316B may be an OCA having adhesive only on the surface coupled to substrate 302. Alternatively, dielectric 316B may be an OCA having adhesive on multiple sides, which may, for example, facilitate coupling dielectric layer 316B to an underling layer, such as a display. Regardless of the particular material used as dielectric material 316A and/or 316B, it may be omitted and/or removed (e.g., by application of a solvent) from certain areas of substrate 302 upon which conductive material 304 is formed, so as not to interfere, for example, with electrical coupling between conductive material 312 and conductive material 304A.

In particular embodiments, touch sensors 200 and/or 300 may include a display panel disposed within the viewing column. For example, a display panel may be disposed inwardly from substrate 202 such that it is visible through cover panel 208. As another example, a display panel may be disposed inwardly from dielectric material 316 such that it is viewable through cover panel 318. The display panel may be a liquid crystal display (LCD), light emitting diode (LED) display, or other suitable electronic display.

Particular embodiments may provide one or more or none of the following technical advantages. Particular embodiments may facilitate relatively inexpensive and efficient manufacturing of a touch sensor and electrically interconnecting its layers. In certain embodiments, for example, the manufacturing costs may be reduced and manufacturing efficiency may be increased by reducing the die sized used in forming a substrate having either a single-sided or a dual-sided touch sensor electrodes. In particular embodiments, the process of coupling an FPC to the electrodes of a substrate may be simplified while potentially enhancing reliability of the touch sensor. Various embodiments may facilitate the mechanical and electrical coupling of various layers, including the mechanical and electrical coupling of a printed circuit (FPC) to a substrate upon which touch sensor electrodes are formed. Certain embodiments may provide one or more other advantages, one or more of which may be apparent to those skilled in the art from the figures, descriptions, and claims included herein.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

Reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

Although the present disclosure has been described above in connection with several embodiments, a myriad of changes, substitutions, variations, alterations, transformations, and modifications may be suggested to one skilled in the art, and it is intended that the present invention encompass such changes, substitutions, variations, alterations, transformations, and modifications as falling within the spirit and scope of the appended claims.

What is claimed is:

1. A touch sensor comprising:
a first substrate comprising a plurality of electrodes formed on a surface of the first substrate;
a second substrate comprising a plurality of electrodes formed on a surface of the second substrate, the surface of the second substrate comprising the plurality of electrodes opposing the surface of the first substrate comprising the plurality of electrodes, respective portions of the first and second substrates spaced being apart from each other by a dielectric material disposed between the respective portions of the first and second substrates, the plurality of electrodes forming of the first substrate each configured to form a capacitively coupled node with at least one of the plurality of electrodes of the second substrate, each capacitively coupled node configured to sense touch of an object, a portion of the second substrate deformed by compression such that a conductive pad on the second substrate and a conductive pad on the first substrate are connected and electrically coupled to each other wherein the portion of the second substrate is deformed by compression such that the conductive pad on the second substrate and the conductive pad on the first substrate are directly touching and galvanically coupled to each other;
a solidified resin that had been injected in a liquid form on the second substrate, the conductive pad on the second substrate being compressed against the conductive pad on the first substrate by the injection of the resin while in the liquid form.

2. The touch sensor of claim 1, further comprising a flexible printed circuit (FPC) held in compression, between the first and second substrates, by the solidified resin.

3. The touch sensor of claim 1, further comprising a flexible printed circuit (FPC) bonded to the surface of the first substrate comprising the plurality of electrodes.

4. The touch sensor of claim 1, further comprising a transparent cover panel formed through an in-mould lamination process on a surface of the first substrate that is opposite from the surface of the first substrate comprising the plurality of electrodes.

5. The touch sensor of claim 4, the transparent cover panel comprising solidified resin that had been injected in a liquid form on the first substrate during the in-mould lamination process.

6. The touch sensor of claim 1, further comprising a dielectric layer coupled to each of the first and second substrates, the dielectric layer disposed between the surface of the first substrate comprising the plurality of electrodes and the surface of the second substrate comprising the plurality of electrodes.

7. The touch sensor of claim 6, the first and second substrates each extending outwardly from the dielectric layer along respective axes that are each parallel to the surface of the first substrate comprising the plurality of electrodes, such that the dielectric layer occupies a majority but not all of a total volume between the first and second substrates.

8. The touch sensor of claim 6, the dielectric layer being a transparent adhesive layer less than 100 microns thick.

9. The touch sensor of claim 2, wherein the flexible printed circuit directly touches the first and second substrates.

* * * * *